(12) United States Patent
Maddali et al.

(10) Patent No.: US 7,873,779 B2
(45) Date of Patent: Jan. 18, 2011

(54) MEMORY PAGE SIZE AUTO DETECTION

(75) Inventors: Srini Maddali, San Diego, CA (US); Arshad Noormohammed Bebal, San Diego, CA (US); Tom T. Kuo, San Diego, CA (US); Tun Yong Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 457 days.

(21) Appl. No.: 12/119,587

(22) Filed: May 13, 2008

(65) Prior Publication Data

US 2008/0288715 A1 Nov. 20, 2008

Related U.S. Application Data

(60) Provisional application No. 60/976,543, filed on Oct. 1, 2007, provisional application No. 60/917,901, filed on May 14, 2007.

(51) Int. Cl.
*G06F 13/00* (2006.01)

(52) U.S. Cl. ............. 711/103; 711/204; 711/E12.008; 711/E12.059

(58) Field of Classification Search ................ None
See application file for complete search history.

(56) References Cited

U.S. PATENT DOCUMENTS

2006/0195650 A1 8/2006 Su et al.
2007/0067520 A1 3/2007 Maddali et al.

OTHER PUBLICATIONS

International Search Report—PCT/US08/006256, International Search Authority—European Patent Office—Dec. 1, 2008.
Written Opinion—PCT/US08/006256, International Search Authority—European Patent Office—Dec. 1, 2008.

*Primary Examiner*—Hetul Patel
(74) *Attorney, Agent, or Firm*—Peter M. Kamarchik; Nicholas J. Pauley; Jonathan T. Velasco (57) ABSTRACT

Methods and apparatuses are presented for memory page size auto detection. A method for automatically determining a page size of a memory device includes receiving page size extents of the memory device, determining a bus width of the memory device, detecting a number of pages having an automatic detection marker, and determining the page size of the memory device based upon the detected number of pages and the received page size extents. An apparatus for automatically determining page size detection includes logic for performing the above presented method.

14 Claims, 7 Drawing Sheets

MEMORY PAGE SIZE AUTO DETECTION

CLAIM OF PRIORITY UNDER 35 U.S.C. §119

The present Application for Patent claims priority to Provisional Application No. 60/917,901 entitled "Flash device page size auto-detection" filed May 14, 2007, and Provisional Application No. 60/976,543 entitled "Memory Page Size Auto Detection" filed Oct. 1, 2007, both of which are assigned to the assignee hereof and are hereby expressly incorporated by reference herein.

FIELD OF DISCLOSURE

The embodiments of the disclosure relate generally to the configuration of memory devices, and more specifically, to automatically determining the page size of a non-volatile memory device during an information processing device's boot sequence for enabling support of memory devices independent of density (e.g., memory capacity size).

BACKGROUND

When an Information Processing Device (IPD) is powered on, it may first undergo a boot sequence to initialize its various hardware and/or software components. The boot sequence may be performed by software having a multi-image boot architecture that can include many code images which may be separately compiled and maintained. The boot sequence may start out by first executing a primary boot code. In general, the primary boot code may be stored in an on-chip non-volatile memory and may be fixed at the time of the IPD's manufacturing. In some cases, the primary boot code can be stored in off-chip non-volatile memory.

After a power cycle (fully off-state to on-state or semi off-state to on-state), the IPD may start executing the primary boot code. As part of primary boot code execution, the IPD may download the secondary boot code or image which may be the next step in the boot-up process of the IPD. The secondary boot code may reside in an off-chip non-volatile memory, and may vary with product and also with product configuration. Different types of memory devices may be used to store secondary boot code, for example, NAND flash, oneNAND flash, m-system flash, NOR flash, EEPROM, ROM, etc. To download the secondary boot code image, the IPD should know the details of the device in which secondary boot code resides (device type) and how to download it (protocol to access the device, how to access the device, how the data stored in the device, etc). As the secondary boot code download occurs during the primary boot code execution, the IPD should have the information (regarding the device in which secondary code is stored and how to download the secondary boot code) in the primary boot code itself. Alternatively, the IPD may be able to derive this information during the primary boot code execution.

Once the IPD finishes primary boot code execution, it may complete the detection of the device that has secondary code, the location of the secondary code in the device (e.g., the address), and how to access the secondary code. In some cases the IPD may download the secondary code form the device to an on-chip memory or off-chip memory, and in some other cases it may only identify the secondary code location and how to access it. After completing the primary boot code execution, the IPD starts executing the secondary code. During the secondary code image execution, the IPD may identify/learn more details of the hardware configuration of the system (what type of system, devices connected, features of the system, system memory size, width, location, protocol to access the system memory, etc.) and also some level SW configuration.

As described above, to download the secondary code, the IPD should determine the device type and its method of access. As there may be different types of devices which need to be accessed during the primary boot, the IPD may perform three general steps to realize access to a memory device: (i) device type detection; (ii) bus interface width detection; and (iii) page/sector size determining of the device (when the device is page/sector oriented). The IPD should complete these steps before it can access the secondary code in the device.

Accordingly for proper operation, an IPD may identify the page/sector size of a non-volatile flash memory device to which it may be connected. Assuming the IPD identified the device type in which a secondary boot code is stored, it can then detect the format in which data is stored. Certain types of flash devices store data in page format (e.g.: NAND, oneNAND, m-system, superAND, etc.). The page size of the device may vary with its density and type of the device. Page size of a given flash device can as low as, for example, 128 bytes and as high as 8 Kbyte, or higher.

With increasing flash device densities, the page sizes are correspondingly increasing. Different techniques may be used to detect the page size and interface bus width of the device by the IPD. One conventional technique may encode the page size and/or bus width by having dedicated external pins to the IPD and the value driven to these pins can indicate the page size of the device and/or the bus width. This approach may be very simple; however, the number of dedicated pins required to support all different page sizes can become large.

Another possible solution may store page size and bus width information in the first page of the flash device, and hardware logic may read the first page from the flash device during the primary boot execution (either the IPD forces the hardware to perform this functionality, or the hardware logic automatically detects and reads the first page). The solution may have no protection against random errors that can occur during the first page read. Flash devices may be prone to random errors, and if the data in the first page gets corrupted either in the flash memory or while the IPD is reading the data from flash memory, there is a possibility the IPD can incorrectly detect the page size which may result in catastrophic failure. Error protection can not conventionally be added at this stage as the page and data format is not known to the IPD at the boot-up time.

To improve the protection against read failures, the page size and bus width may be encoded using unique numbers, known as a magic numbers, which provide protection against random errors. Page size and bus width may be encoded into a unique magic number and put in the first page of the device. The IPD may detect the page size based on the magic numbers stored in the first page and then accesses the secondary boot code based on the page size. This implies the secondary boot code/image must be compiled and maintained for each flash device (page and bus width sizes). As the number of different types of flash memory devices continues to grow, it may become costly to develop, manage, and maintain separate software builds which correspond to different flash devices.

Accordingly, there is a need for a new automatic page size detection approach which may support flash device configuration utilizing common software in order to reduce development and maintenance costs.

SUMMARY

Exemplary embodiments of the disclosure are directed to methods and apparatuses for memory page size auto detection.

An embodiment of the invention can include a method for automatically determining a page size of a memory device, comprising: receiving page size extents of the memory device; determining a bus width of the memory device; detecting a number of pages having an automatic detection marker; and determining the page size of the memory device based upon the detected number of pages with the automatic detection marker and the received page size extents.

Another embodiment can include an apparatus for automatically determining a page size of a memory device, comprising: logic configured to receive page size extents of the memory device; logic configured to determine a bus width of the memory device; logic configured to detect a number of pages having an automatic detection marker; and logic configured to determine the page size of the memory device based upon the detected number of pages with the automatic detection marker and the received page size extents.

Another embodiment can include an apparatus for automatically determining a page size of a memory device, comprising: means for receiving page size extents of the memory device; means for determining a bus width of the memory device; means for detecting a number of pages having an automatic detection marker; and means for determining the page size of the memory device based upon the detected number of pages with the automatic detection marker and the received page size extents

BRIEF DESCRIPTION OF THE DRAWINGS

The accompanying drawings are presented to aid in the description of embodiments of the disclosure and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation. The term "magic numbers" is used herein to define numbers which are determined based upon a minimum weight algorithm, and are used in various embodiments so that memory read errors may not be correlative. The word "external memory" is used herein to mean a memory device which is not located within the confines of a processing unit, which in turn may mean that the memory device is not formed on the same die as the processing unit. The word "internal memory" is used herein to mean a memory device is formed on the same die as the processing unit.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
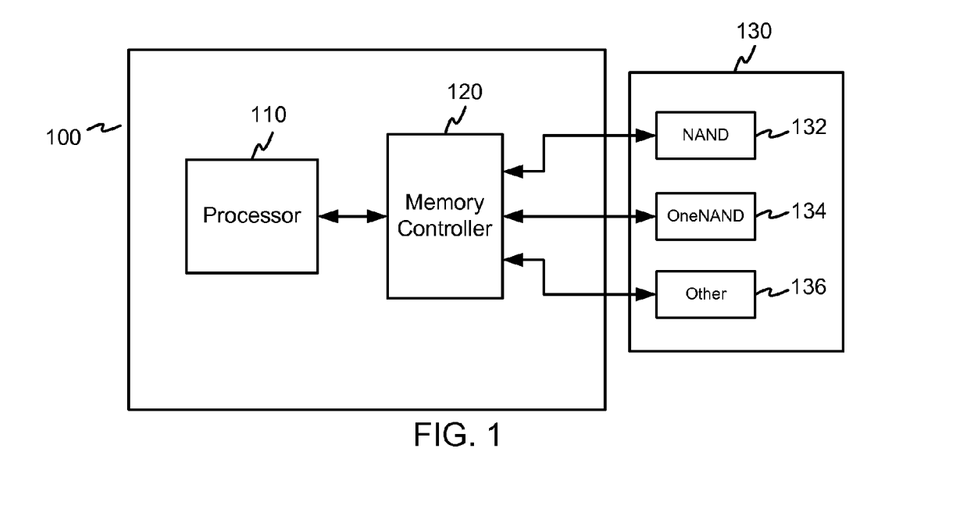
FIG. 1 is a block diagram of an Information Processing Device which may include a processor, a memory controller, and various different types of memory devices.

FIG. 1 is a block diagram of an Information Processing Device (IPD) 100 which may include a processor unit 110, a memory controller 120, and an external memory device 130. The external memory device 130 may include various different types of external memory devices, which may include NAND flash memory 132, OneNAND flash memory 134, and/or any other known types of memory device 136 (such as, for example, m-system flash, NOR flash memory, EEPROM, ROM, SDRAM, etc.). The memory controller 120 may be a combination of multiple controllers to interface with different type of memory devices mentioned above. During normal operation after the boot sequence is completed, the processor unit 110 may read and/or write data from and/or to the external memory device 130 through memory controller 120. Such communications occurring after the boot sequence has finished may take place in a conventional manner.

The IPD 100 may further include other devices not shown in FIG. 1, for example, graphics, video, audio, CDMA, and/or GSM/GPRS processors; I/O interfaces; etc. The IPD 100 may be part of any type of computer based system, including portable and/or embedded systems which may be used in laptop computers, personal digital assistants (PDAs), and/or mobile communication devices. For example, the mobile communications device may be a handset for use in mobile communications systems, and the IPD 100 may be a Mobile Station Modem (MSM™) chipset for use within the handset. The processor may be any type of microprocessor and/or microcontroller, such as, for example, a processor from the ARM9 family. The memory controller may include a one or more bus interfaces and/or multiple memory controllers for a variety of different memory types. For example, the memory controller 120 may have a single memory controller to interface all types of memory devices or multiple memory controllers to access the memory devices. In the embodiment shown in FIG. 1, the IPD 100 may interface with NAND 132, OneNAND flash memory 134, and/or other types of memory 136 (e.g., m-system flash, NOR Flash memory, etc.).

When the IPD 100 is either turned-on or power cycled, the processor unit 110 may execute a cold boot sequence to initialize its various hardware and/or software components. The software/firmware which executes the boot sequence may include a plurality of separately compiled routines, wherein each routine performs a different functionality in the boot sequence. The initial routine in the boot sequence may be a primary boot loader (PBL), which sets up the IPD 100 to access and/or download code from a non-volatile external memory device 130. Setting up the IPD 100 may include identifying the type of non-volatile memory connected, reading the configuration data from this memory, processing the data and identify the memory configuration of the system, configuring the memory devices in the system as needed, and copying the code from non-volatile memory to the main memory. The PBL may reside in the on-chip boot ROM for various chipsets in the MSM™ chipset family. The PBL may be vectored to when the processor unit 110 is release from reset. When executed by the processor unit 110 during the cold boot, the PBL may initialize IPD 100 hardware, initialize internal RAM within the processor unit 110 or external RAM, detect non-volatile external memory device 130, load and process the configuration data from non-volatile external memory, load subsequent boot routines.

In one embodiment, the PBL 100 may configure the memory interfaces using the configuration information in the non-volatile external memory device 130 which includes NAND flash memory 132, OneNAND flash memory 134, and/or NOR flash memory (not shown). The memory controller 120 may be capable of supporting different interface data with a variety of memory devices, including NAND devices and OneNAND devices.

In order to address any data in the external memory device 130, the memory controller 120 should identify the external memory device's type and how to access it. The IPD 100 may find the type of non-volatile memory device used and its protocol to access the data in the device, and device's interface bus width. For example, if the external non-volatile memory is a NOR flash memory, the IPD 100 should to know the size of the NOR flash memory (to detect the number of address bits required to access the NOR flash memory), interface data bus width, and how to access the data in the device. For a NAND, oneNAND, m-system, and superAND flash devices, the IPD 100 should know page/sector size, block size, interface data width, and protocol to access the data. Page/sector size and block size indicates the size of the device. This may be accomplished by detecting the page size and bus width of the external memory device 130. Once this is done, the memory controller 120 may be suitably configured, thus enabling the processor 110 to address any page of the external memory device 130. Various embodiments of the disclosure may perform page/sector size detection of page/sector based flash devices so that the IPD can configure the memory controller 120 suitably to access the flash device connected 130. This may be performed in a manner independent of the connected flash size (e.g., page size, block size, and interface width).

The access protocol may be different for NAND and superAND devices with page size less than or equal 512 Bytes and greater than 512 Bytes. To access the NAND flash device, the IPD 100 should know whether device page size is greater than 512 Bytes so that it can use the correct protocol to access the device. This step can be skipped if the IPD 100 needs to support NAND/superAND flash devices page size greater than 512 Byte only. Similarly detecting the interface data bus width (8-bit/16-bit, or greater) may be performed so that the IPD 100 can access the data correctly. If the IPD 100 needs to support only fixed interface width flash device, this step may also be skipped. An exemplary approach for determining whether a NAND flash device size is greater than 512 Bytes, and detecting the interface data bus width, is described in U.S. patent application Ser. No. 11/231,389, filed on Sep. 20, 2005, which has published as U.S. Patent Publication No. 2007/0067529, which is incorporated herein by reference in its entirety. The details of which are briefly described below.

Hardware Page Size Detection

Various embodiments of the invention may include a process for estimating the page size of the external memory 130 based upon a hardware approach. This approach may be able to determine whether the page size is a smaller page size (512 Bytes or less), or greater than or equal to a larger page size (higher than 512 Bytes). The hardware page size detection may be performed by the memory controller 120, which may first perform a read initialization command (details of the command described in the subsequent paragraphs) on the external memory 130. The memory controller 120 may then wait for a specified period of time (typically on the order of 100s of nanoseconds). Then, the memory controller 120 may determine whether the memory device 130 is performing the read command by checking a busy (BSY) signal. If the memory device 130 is busy, the memory device has a smaller page size. On the other hand, if the device is not busy, the memory device has a larger page size. This behavior occurs because the memory device having the smaller page device can react to read command with single command or opcode (read initialization command) where as large page size device requires two read commands (read initialization command and read start command) for the read operation. Large page device waits for the read start command and until the read start command is issued, it will not move to busy state. The memory controller 120 may detect this difference and identify if the NAND/superAND flash device connected is larger page size or not.

An example of the hardware page size detection is presented below in the context of NAND type memory devices. When the external memory device 130 is a NAND type flash memory 132, the smaller page size may be 512 bytes or less, and the larger page size may be greater than 512 Bytes (e.g., 2 Kbytes or greater).

NAND memories having 512 byte page devices may use the following read command sequence:

Read initialization command (1 cycle command); and

Data/page address command (3 or 4 or 5 or more cycles) (If more address cycles are issued than required by the device, the device will accept the required addresses at the beginning and ignore the last address cycles).

Within certain time but no later than few micro seconds after issuing the address cycle, the device will move to BUSY state by asserting the BSY signal to indicate it is executing the read command. If the device responds with BSY signal it is a smaller page (512 byte or less) device.

NAND memories having greater than 512 bytes (e.g. 2 Kbyte page sizes or larger) will not move to BUSY state after the address cycles. These devices require a second read start command or opcode to move to BUSY state. And the read command sequence for these devices is:

Read initialization command (1 cycle command);
Data/page address command (3 or 4 or 5 or more cycles) (If more address cycles are issued, the NAND device may accept the required addresses from the beginning and ignore the last address cycles); and
Read start command (1 cycle command).

Within a certain time, but no later than few micro seconds after issuing the read start command, the device will move to BUSY state by asserting the BSY signal to indicate it is executing the read command.

The memory controller 120 may use the above mechanisms to detect the NAND/superAND device page sizes. The controller may execute a process within a state machine that performs the following: 1) resets the device; 2) issues a read command; 3) issues address cycles; 4) waits for some time but no later than few micro seconds; and 5) checks to determine if device moved to busy state or not, and if moved to busy state, the device has 512 byte or less page size; 6) if not moved to busy state, issues read start command; 7) waits for some time but no later than few micro seconds; and 8) checks to determine if device moved to busy state or not, and if moved to busy state, the device has a greater than 512 Bytes (e.g. 2 Kbyte or larger) page size.

After detecting the device page size, the memory controller 120 may concurrently or thereafter perform a read data transfer in 8-bit mode (even if the connected device is 16-bit or more, the controller only uses the lower 8-bit data from the device). The data read from the flash device can be used to detect the bus size and any other parameters of the flash. Bus width detection will be explained in more detail below. As mentioned above, the data in the first page stored in unique number format (e.g., a magic number) to reduce the probability of random errors. The magic numbers are picked such that, even in the case of error the resulted number will not be another magic number. The IPD will detect such random errors as it knows the magic numbers expected and if the data in the first page (data transferred with the page size detection) is not correct, the PBL can read another page from the device (redundant page in a different location of the device). Without detecting the page size, the PBL can not proceed further and may report that an error condition has occurred.

The hardware page size detection method may be limited in the respect that it may only be able to detect whether the page size of the external memory device 130 is smaller (e.g., 512 bytes or less) or greater or equal to a lager page size (e.g., 2 Kbytes or more). Embodiments presented herein may utilize software page size detection techniques, which can be used in conjunction with the hardware based approach, to overcome this limitation.

Bus Width Detection

Figure 2A:
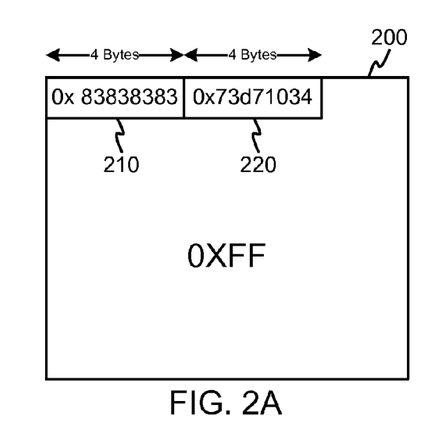
FIG. 2A is a diagram of an exemplary first page residing within a memory device which can be used to determine the bus width of the memory device.
Figure 2B:
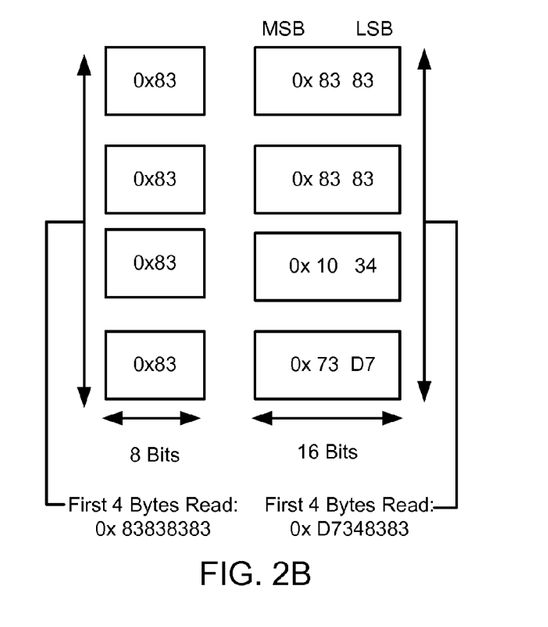
FIG. 2B is a diagram showing how data in the exemplary first page is read from memory devices having an 8 bit bus width and a 16 bit bus width.

FIG. 2A is a diagram of an exemplary data structure residing within a memory device which can be used to determine the bus width. Because different types of external memory devices utilize different data word sizes, the bus width should be determined during the boot sequence by the PBL. The bus width may be determined using configuration data stored in a data structure on the memory device 130. This determination may be performed by checking the code word after it is read using a given bus width. When reading using a narrow bus width, the first code word may be returned unaltered. However, when a wider bus width is used, the code word may be changed (for example, as shown in the description of FIG. 2B below, the first code word may be interleaved with the second code word). By checking what number the read command produces, the bus width of the memory device 130 may be determined.

Further referring to FIG. 2A, the configuration data may include one or more code words 210, 220. The code words may be written in the first eight bytes of the first page 200, within the first block of the external memory device 130. Code word 210 is referred as 8_BIT_MagicNumber and 220 is referred as Config Magic Number. The rest of the page may contain all ones (0xFF). Because Error Correction Coding (ECC) may not be enabled during this process, the code words may be specially selected numbers in order to minimize read errors. One class of numbers which may be used are those which are generated using a minimum weight algorithm. These numbers may be known as "magic numbers," and can reduce correlated read errors. Other numbers having the ability to avoid read errors may also be used.

In an embodiment of the invention where external memory device 130 includes NAND and/or OneNAND devices, the following example is presented. Current OneNAND flash devices may only be available in 16 bits, an memory controller 120 may be set to 16 bits by default when interfacing with oneNAND device. The techniques described in this embodiment can be applied to detect the page size of oneNAND device if required. However, a memory controller may be set to 8 bits during initialization. In order to detect if the bus width of the flash device is 8 or 16 bits or even more, 8 bytes of unique numbers also referred as magic numbers are placed at the start of the page containing the configuration data. The first 4 bytes data structure 210 (8_BIT_Magicnumber) may hold the magic number 0x83838383, the next 4 bytes data structure 220 (Config Magic Number) may hold the magic number 0x73D71034, while the rest of the page may hold the data 0XFF, as shown in FIG. 2A. During the hardware page size detection method (as explained above), the software may request the memory controller 120 to read 4 bytes of data from page 0 of block 0 of configuration data. When the 4 bytes of data is read, the ECC engine is disabled. The magic numbers (using the minimum weight algorithm) are chosen such that when the data is read, the errors are not correlative.

FIG. 2B is a diagram showing how data in the data structure 200 is read from memory devices having an 8 bit bus width and a 16 bit bus width. Because the 4 bytes of data read will be different for devices of different bus width, the data received after the read operation is performed can be used to determine the bus width of the memory device 130. When the device reads the first 4 bytes using an 8-bit bus width, the first code word is read without being altered. However, when a device has a 16 bit bus width, the read command will return a value which interleaves the least significant bits of the first code word and the second code word.

More specifically, for an 8-bit flash device, the original 8_BIT_magic number value 0x83838383 should be returned. For a 16-bit flash device, the flash memory should return 16 bits of data during the read operation. This interleaving occurs in the 16-bit device because the memory controller 130 is still configured as having an 8-bit wide bus, so it will only read the 8 least significant bits and disregard the 8 most significant bits. Therefore, the controller will read the interleaved value of 0xD7348383. Based on the returned data the IPD detects the bus interface width. Though the examples given in this embodiment describes only for 8-bit and 16-bit, the same techniques can be applied for interfaces having higher bit widths.

Software Page Size Detection

Figure 3:
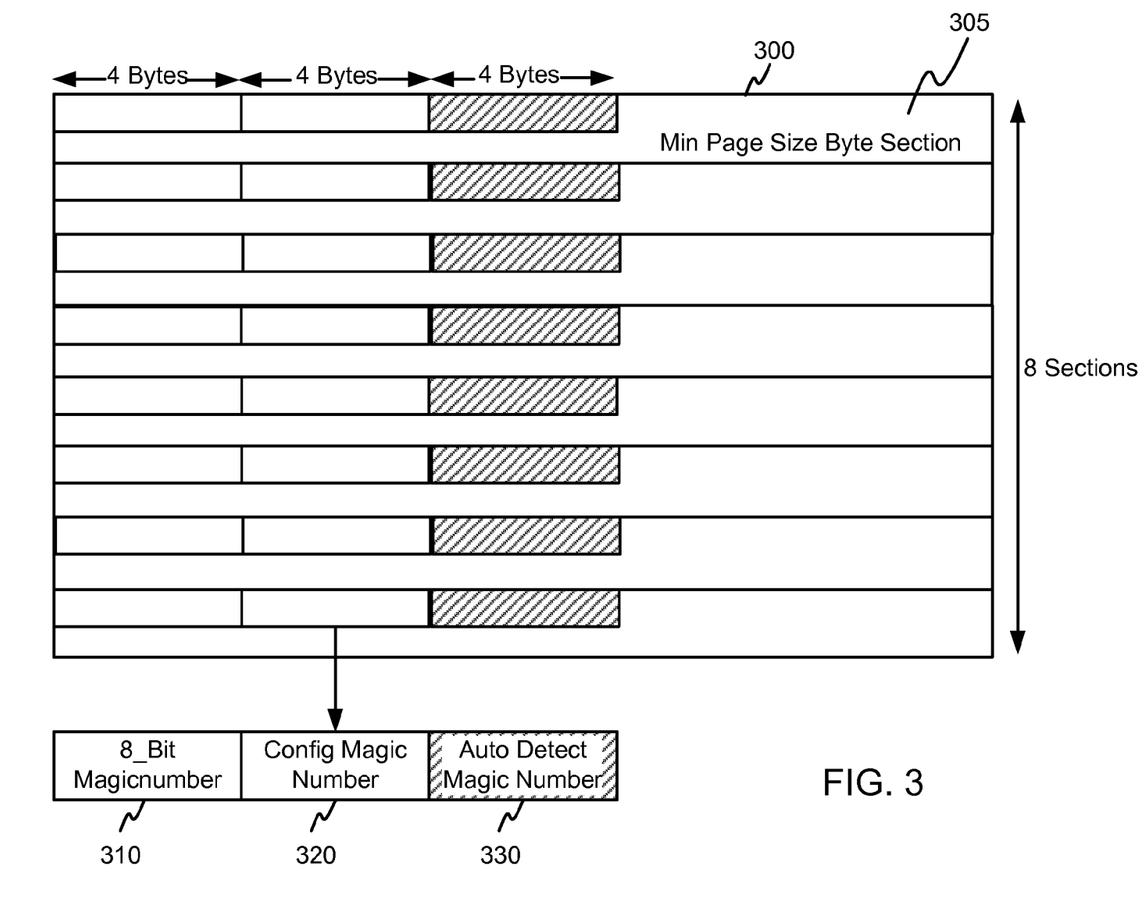
FIG. 3 is a diagram of an exemplary data structure which may be used to determine both the bus width and page size of a memory device.

FIG. 3 is a diagram of an exemplary data structure 300 within a memory device 130 which may be used to determine both the bus width and page size of the memory device 130. In order to perform the automatic page size detection algorithm, the memory device 130 may have sections of "dummy data" added for determining the page size of the memory device 130. Each section 305 may include three code words 310-330, with the remainder of the section containing dummy data. This dummy data may be data of all "1's" or loaded with default data that comes with flash device after manufacturing. The only condition is the data stored after the three magic numbers (8_BIT_MagicNumber, Config Magic Number, Auto Detection Magic Number) should be a known value so that error correction can be done on the data. The code words 310 and 320 may be used to determine the bus width as described above. The third code word may be an automatic detection marker which may be used by an algorithm to determine the page size of the memory device 130. While FIG. 3 indicates an exemplary size of the code words as being 4 bytes, other sizes may of course be used. In various embodiments, each of the code words may be magic numbers in order to minimize read errors. The details of the algorithm will be presented below in the description of FIG. 5.

The extents of the page sizes which may be encountered by the PBL 100 would be known as they would represent the maximum (MAX) and minimum (MIN) allowable page sizes which may be supported, which may be predefined. In some cases the MAX and MIN page sizes are fixed at the time of manufacturing of the IPD, and in some other cases these numbers are programmable after the manufacturing of the IPD but fixed before being sent it to a customer. The size of each section 305 may be equal to the MIN page size. The MAX and MIN page size supported will determine the number of sections that need to be added. The number of sections are expressed by the following ratio:

Number of sections=(MAX PAGE SIZE/MIN PAGE SIZE)

In an embodiment of the invention, the first 12 bytes of each section 305 may be marked with magic numbers, as shown in FIG. 3. The first 8 bytes of each section 305 may hold the 8_Bit_Magic number 310 and the Config Magic Number 320, similar to the bus width detection approach described above. Another 4 bytes of a magic number, an Auto Detect Magic Number, may be placed after the first 8 bytes. The software page size detection method will check the Auto Detect Magic Number to derive the page size using an algorithm explained below.

Figure 4:
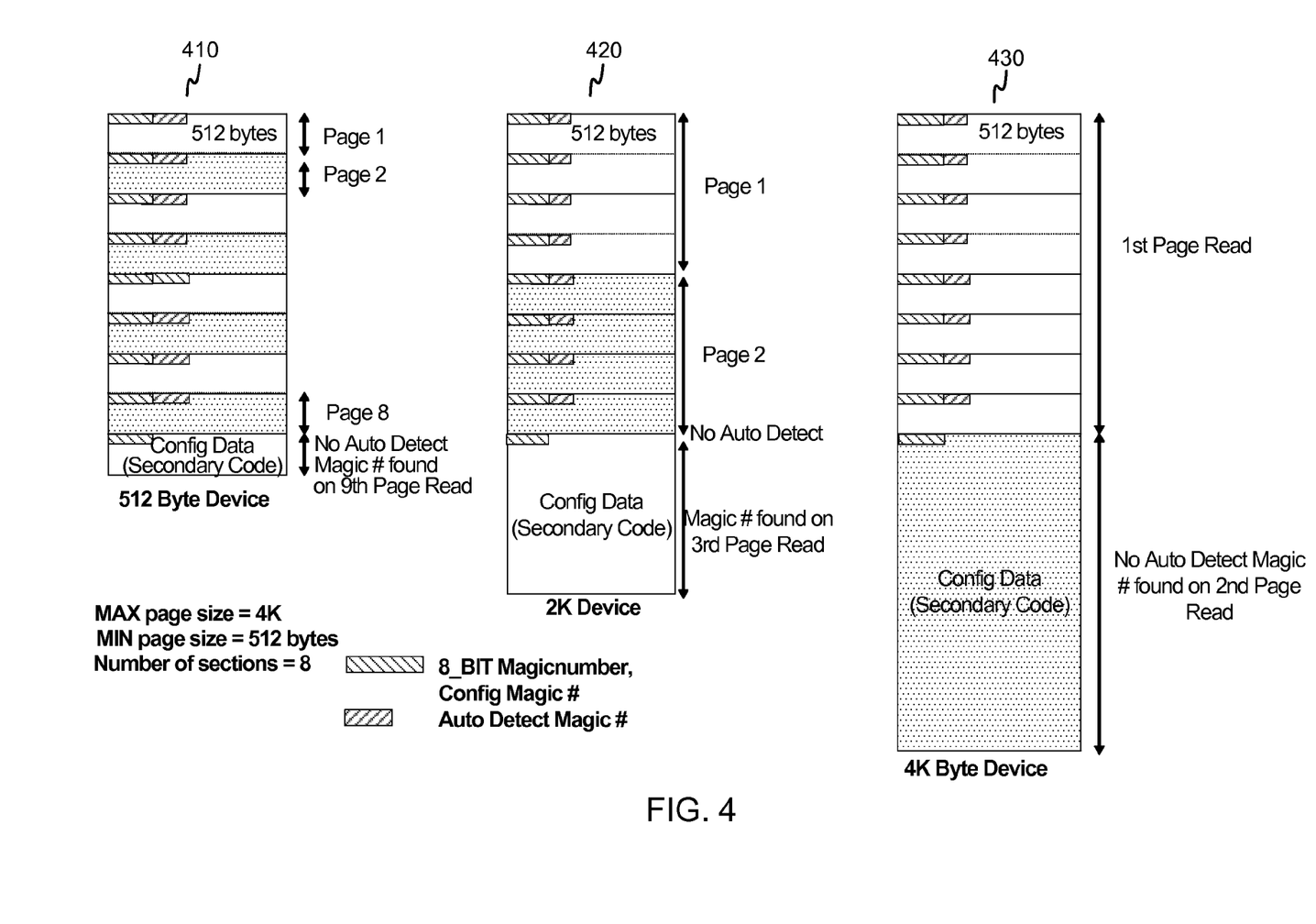
FIG. 4 is a diagram showing how the exemplary data structure shown in FIG. 3 which is contained within memory devices having different page sizes.

FIG. 4 is a diagram showing how the exemplary data structure shown in FIG. 3 is contained within memory devices having different page sizes. As the page size of the memory device 130 changes, the number of sections which may be stored in each page will also change. The number of pages which may be needed to fit all the sections can be determined by the Page size of the attached device using the following equation:

$$\text{Number of pages} = \frac{(\text{Number of sections}) * (\text{MIN Page Size})}{(\text{Device Page Size})}$$

A number of examples are presented below for different page sizes. Each example is pictorially represented in FIG. 4, which shows the data structures associated with three different page sizes, 512 Kbytes (410), 2 Kbytes (420) and 4 Kbytes (430). The numerical examples are as follows.

Given a MAX page size=4K bytes and a MIN page size=512 bytes, the number of sections will be 8. This implies that the number of pages to fit all 8 sections will be:

8 pages for 512 byte page size device (since the page size of the device is 512 Bytes, requires 8 pages to fit 8 sections of 512 bytes of data);

2 pages for a 2 Kbyte page size device (since the page size of the device is 2 Kbytes, requires 2 pages to fit 8 sections of 512 bytes of data (4 512-bytes per page)); and 1 page for a 4 Kbyte page size memory device (8 sections of 512 bytes of data will fit in single page for a 4 Kbyte page device).

As will be explained in the description of FIG. 5 below, the number of page sizes may be determined directly by the processor unit 110 by counting the automatic detection marker (exemplified as the "Auto Detect Magic #" shown in FIG. 4).

Figure 5:
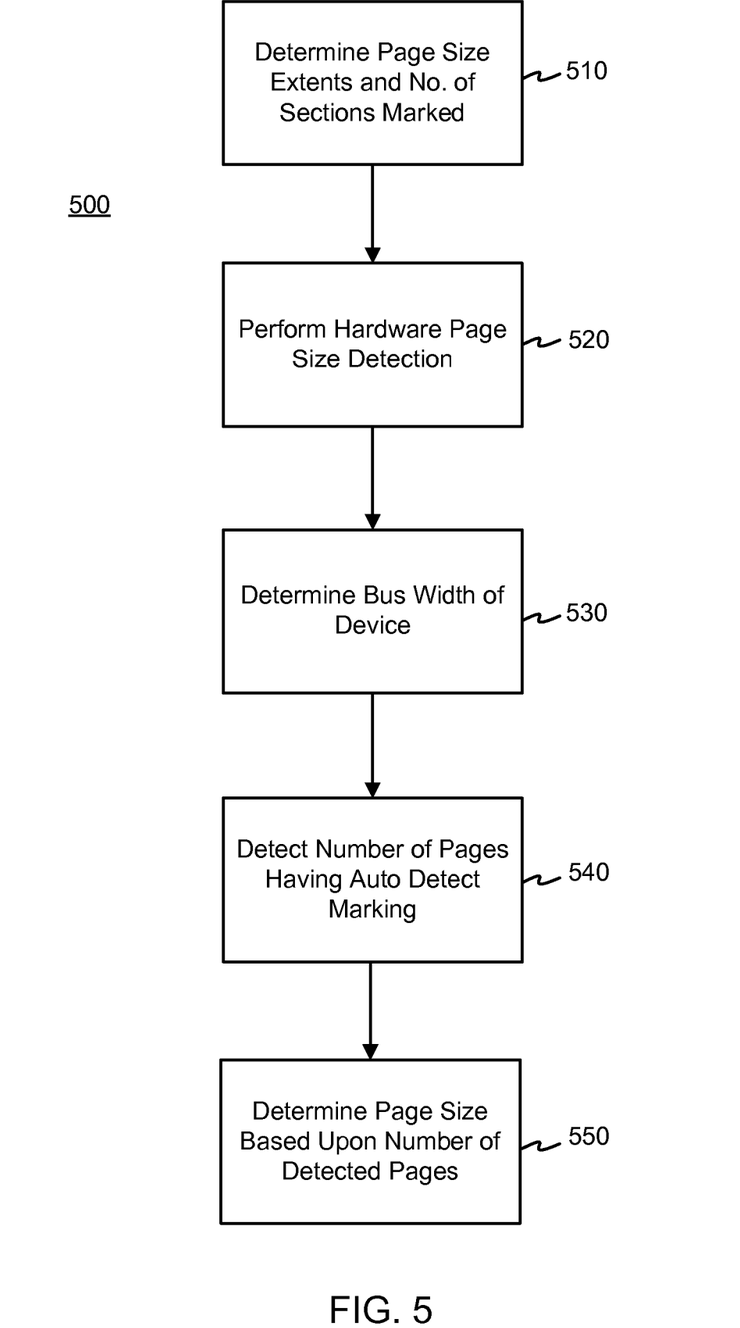
FIG. 5 is a flow chart depicting an exemplary process for detecting the page size of a flash device.

FIG. 5 is a flow chart depicting an exemplary process 500 for determining page size of the flash memory device. The process will start by determining the extents of the page sizes for supported memory devices 130 (i.e., determine the MIN and MAX values). The MIN and MAX values may be preset values. The number of sections which are marked may then be determined by taking the ratio of the MAX to MIN page size values (block 510). Hardware page size detection may then be performed by the memory controller 120 to determine if the memory device 130 has a page size greater than 512 bytes or not (block 520). The bus width of the memory device 130 may then be detected by the processor unit 110 (block 530). The processor unit 110 may then detect the number of pages having an automatic detection marking (block 540). The processor unit 110 will perform a sequence of read operations to detect the number of pages having an automatic detection marking (block 540). The processor unit 110 may then compute the page size of the memory device 130 based upon the number of pages read having an automatic detection marking (block 550). Note that when the IPD 100 is accessing NAND flash device, it may use the Hardware page size detection to detect whether the device connected page size greater than 512 Bytes or not and uses this information to issue read command to the device.

Because data in the memory device 130 may be stored in pages, access from the memory controller 120 to the memory device 130 may result in accessing an entire page. Accordingly, a write or read associated with the memory device 130 will be page oriented. Since a memory device 130 with a larger page size is able to store more number of sections 305, the memory controller 120 reading data from the memory device 130 will read fewer pages containing the magic numbers. If the first two pages in the memory device 130 are marked with the correct automatic detection markings (e.g. magic numbers), then the processor unit 110 can conclude that the attached device has a 2 Kbyte page size using the formula shown below (512*8/2=2 K). If the automatic detection marker is present only in the first page but not the second, then it can be concluded that the attached device is greater than 4 Kbyte page size again based on the formula shown below (512*8/1=4K).

The page size of the device can be found using the formula below:

$$\text{Device Page Size} = \frac{(\text{Min Page Size}) * (\text{No of Sections Marked})}{\text{No of Pages Read}}$$

Once the page size and bus width of the memory device is determined, the memory controller 120 may now be configured to the correct settings.

Figure 6:
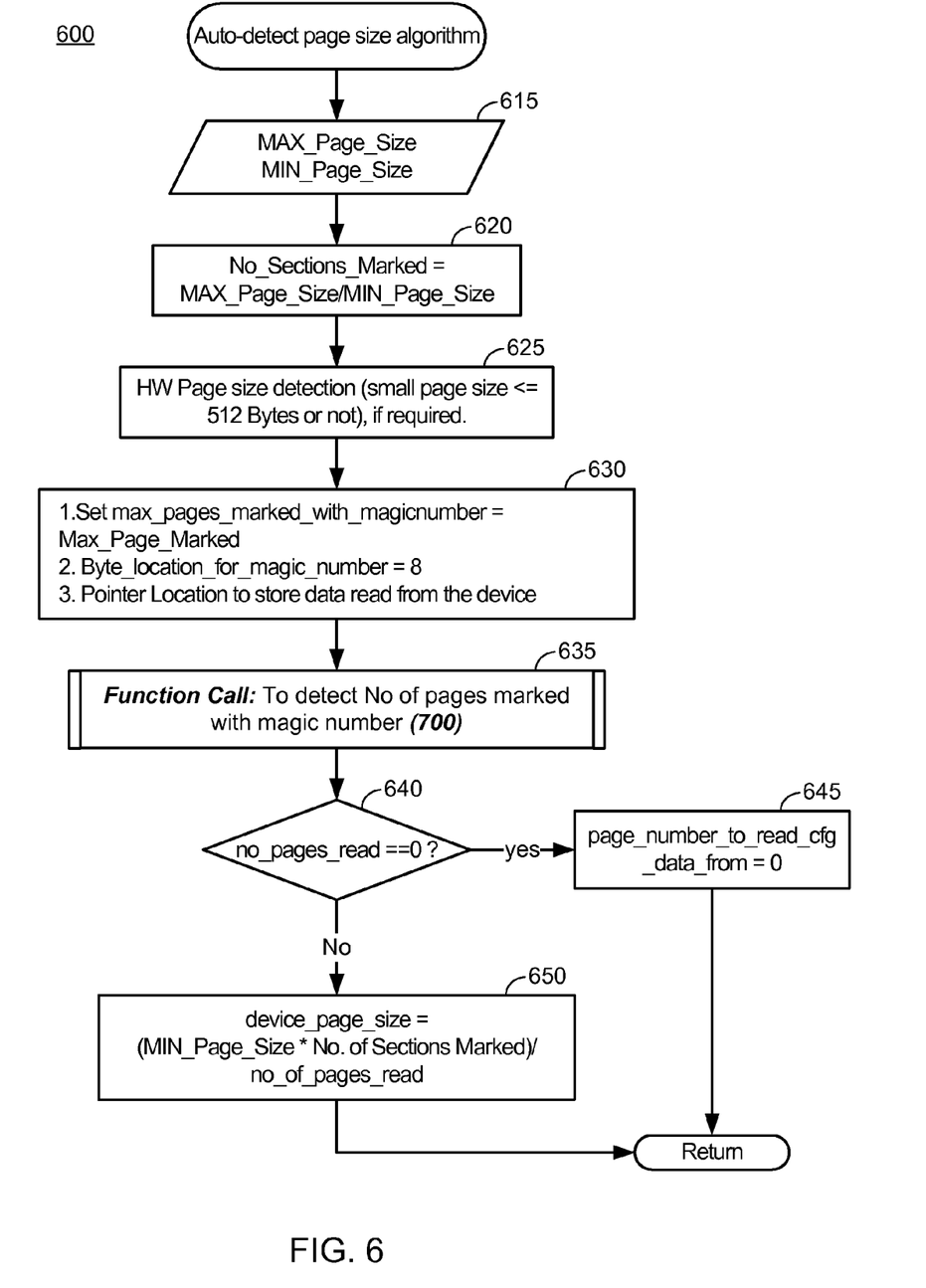
FIG. 6 is a diagram showing another exemplary process counting the number of automatic detection markers.

FIG. 6 is a flow chart of depicting another exemplary process 600 for determining parameters associated with a memory device. Initially, the MAX page size and MIN page size may be obtained as these are typically predefined values (block 615). The number of sections marked with an automatic page detection marker may be computed (block 620). A hardware page size detection may then be performed to determine if the page size is greater than 512 bytes (block 625), if required. If not required, this step can be skipped.

Block 630 may perform the following actions: set max pages marked with magic number to MAX pages marked; set Byte location for magic number to 8; and set pointer location to store data from the device. Next, a function call (details of which are presented below in FIG. 7 and in the associated description) detect the number of pages marked with a magic number may be called (Block 635). The function call may return the Number of Pages Read with Auto Detect Magic Number. A conditional may then be performed to check if the number of pages returned by the function call is zero (Block 640). If so, the page number to read configuration data from is set to 0 (Block 645), and the process returns. If the number of pages marked is not zero in Block 640, the device page size is computed (Block 650) and the process then returns.

Figure 7:
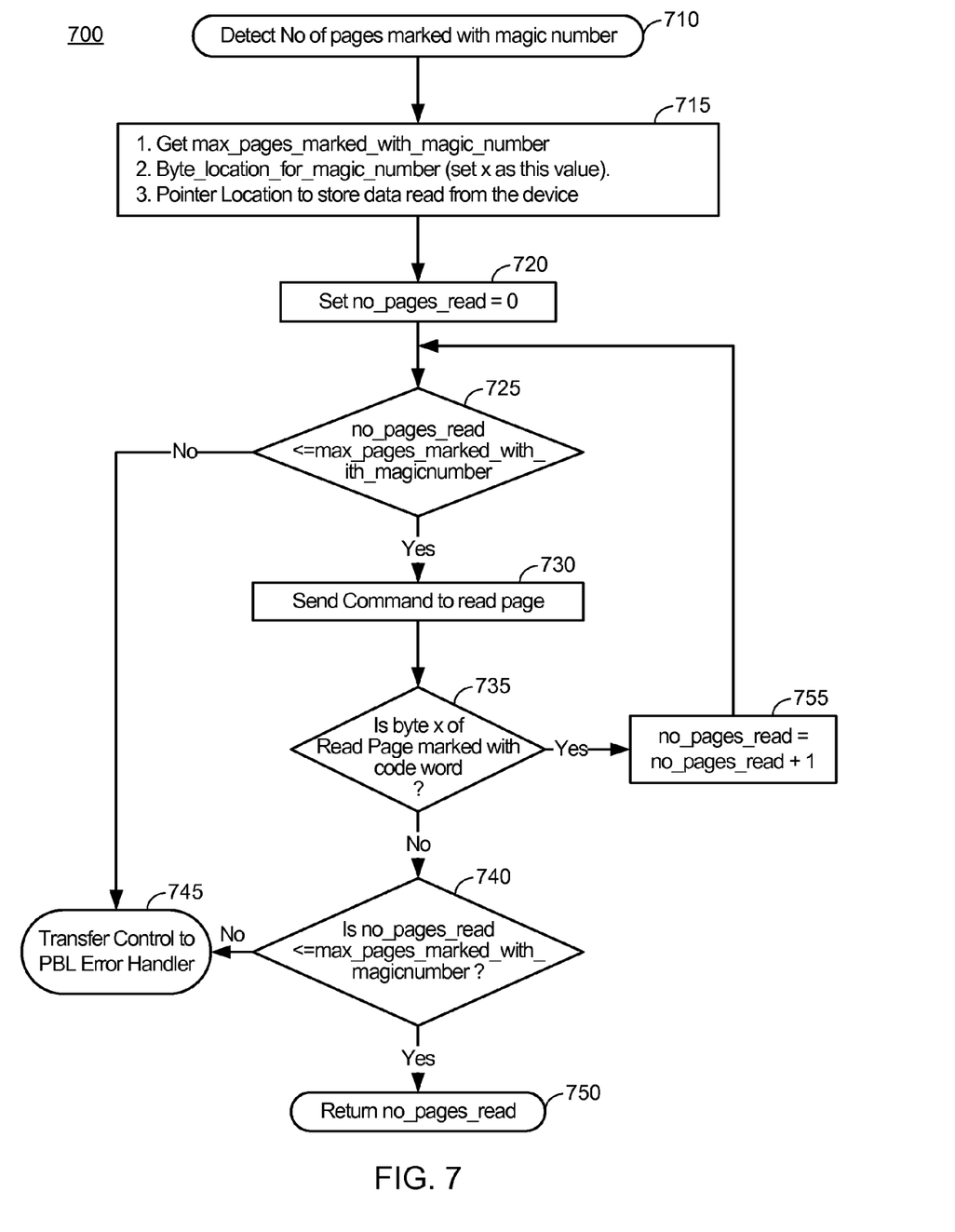
FIG. 7 is a flow chart depicting an exemplary process for determining parameters associated with a memory device.

FIG. 7 is a flow chart depicting an exemplary process for counting the number of automatic detection markers. Initially the following parameters may be obtained: MAX pages marked with a magic number, the byte location for the magic number (set "x" as this value (as an example, the location is shown as 8), and the pointer location to store data may be read from the device (Block 715). The number of pages read may then be initialized to 0 (Block 720). A conditional may be performed to determine if the number of pages read is less than or equal to the max pages marked with a magic number (Block 725). If so, the page may be read (Block 730), and another conditional may then be performed to check if byte "x" of read page is marked with code word (Block 735). If so, the page counter is incremented (Block 755), and the process returns to Block 725. If condition in Block 735 fails, another conditional check may be performed to determine if the number of pages read is less than or equal to the max number of pages marked with a magic number (Block 740). If the conditional performed in Block 740 is true, the process 700 returns the number of pages read (Block 750); and if the conditional in Block 740 is false, an error control handler is called (Block 745). Also, the error handler is called (Block 745), if the conditional performed in Bock 725 is false.

The memory controller 120 may perform error correction on the read data in block 730 before checking byte x for a magic number in block 735. The memory controller 120 may check the data integrity during the error correction checking. The result of this error correction checking may include the following. The controller may detect that the data read from the device is intact and no errors are detected. In this case case, processing will proceed accordingly. Alternatively, the controller 120 may detect errors wherein number of errors detected is less than the maximum number of correctable errors (based on the ECC algorithm used). In this case, the controller 120 may correct the errors and then proceed accordingly. Alternatively, the controller 120 may detect errors which cannot be corrected. In this case, the controller 120 may return processing control to an error handler. Error correction will provide extra protection for the magic numbers stored in the device against random errors.

Various embodiments of the disclosure may enable ECC operations so that the integrity of the page detection process may be protected by magic numbers as well as conventional ECC algorithms. This combination of approaches can provide a more robust way to determine the page size of flash devices.

Figure 8:
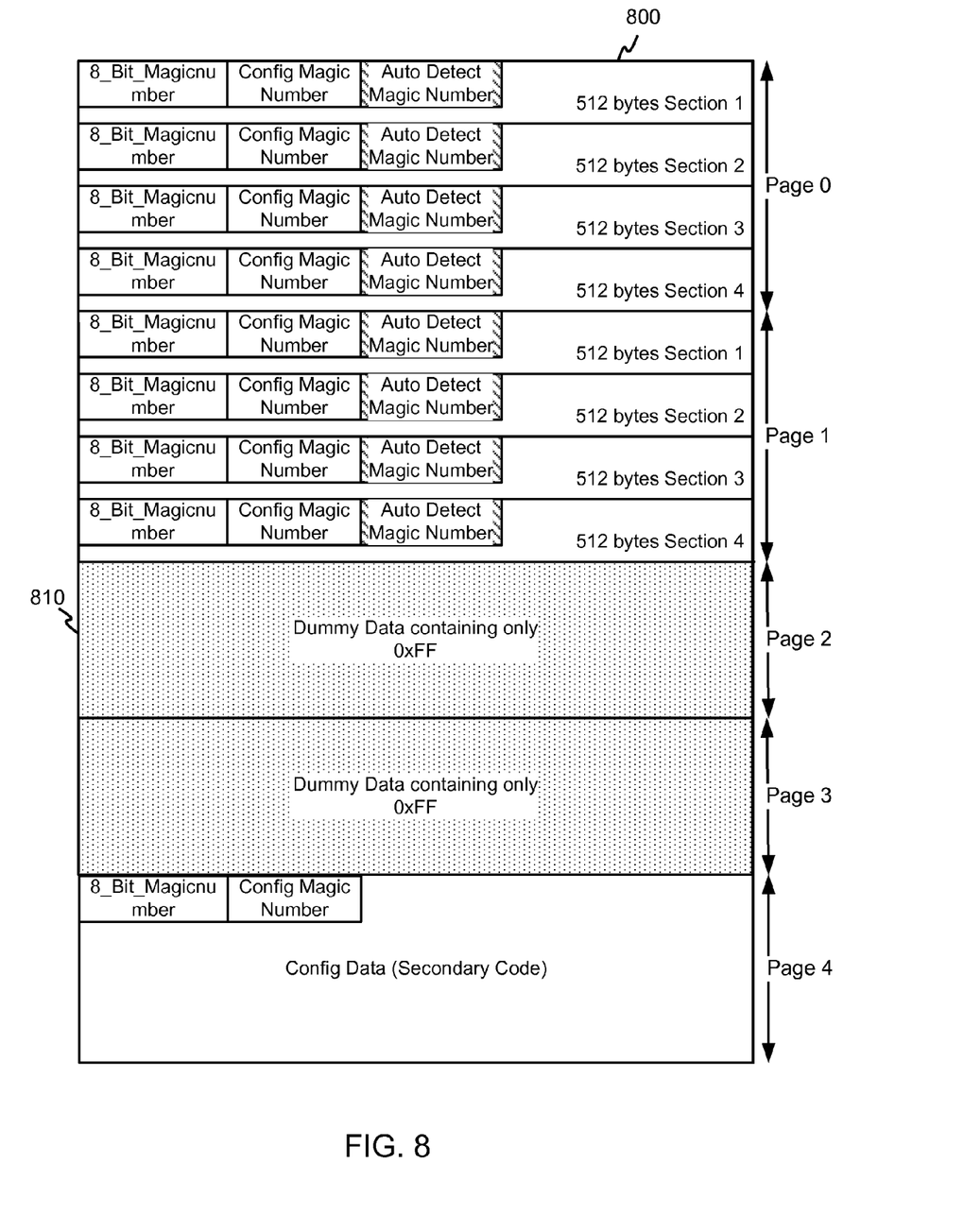
FIG. 8 is a diagram depicting data structure organization in the a flash memory device

FIG. 8 is a diagram showing another exemplary data structure 800 having a section of dummy data. Based on the system requirements, config data can be stored in the page next the last page that has Auto Detect Magic Number or multiple pages of dummy data may be added between the last page with Auto Detect Magic Number and config data as shown in FIG. 8. The number of pages with dummy data may also be predefined for the IPD so that after detecting the device page size, the IPD can skip the dummy data pages and read the config data. In the FIG. 8, the IPD detected only first 2 pages (Page 0 and Page 1) has the Auto Detect Magic Number. As the example given above, if the MIN page size=512 Bytes, Number of Sections with Auto Detect Magic Number=8, device page size=2 Kbytes (512*8/2) based on the formula above. It also has 2 pages of dummy data and hence the IPD will jump to page number 4 to read secondary boot code. It is possible the IPD inserts no dummy data pages after the last page with Auto Detect Magic Number and in which case, the IPD will start reading the secondary code from Page 2 as shown in FIG. 8.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for memory page size auto detection. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method for automatically determining access parameters of a memory device, comprising:
   determining a bus width of the memory device; and
   determining a page size of the memory device;
   wherein the memory device which is divided into sections, each section comprising a first four byte word having an 8-bit magic number and second four byte word having a configuration magic number in first and second adjacent locations in the memory device and an automatic detection magic number in a third location in the memory device;
   wherein determining the bus width comprises:
      reading a first four bytes from the memory device in an eight bit mode; and
      determining whether the first four bytes read from the memory device correspond to an interleaving of the first four byte word and the second four byte word; and
   wherein determining a page size of the memory device comprises:
      receiving minimum and maximum page sizes of the memory device;
      determining a number of sections marked by computing a ratio of the maximum possible page size and the minimum possible page size;
      detecting a number of pages having an automatic detection magic number; and
      determining the page size of the memory device by computing the ratio of the number of sections marked times the minimum possible page size and the detected number of pages with the automatic detection magic number.

2. The method according to claim 1, wherein determining that the first four bytes read from the memory device do not correspond to an interleaving of the first four byte word and the second four byte word indicates that the memory device has an 8-bit bus width.

3. The method according to claim 1, wherein
   determining that the first four bytes read from the memory device correspond to an interleaving of the first four byte word and the second four byte word indicates that the memory device has a 16-bit bus width.

4. The method according to claim 1, wherein the detecting the number of pages further comprises: reading sequentially a series of pages from the memory device; and counting the number of pages which contain the automatic detection magic number.

5. The method according to claim 4, further comprising:
   reading a page of data from the memory device; and
   testing whether the data contains the automatic detection magic number.

6. The method according to claim 5, wherein when it is determined the data contains the automatic detection marker, magic number comprising:
   incrementing a counter corresponding to the number of pages read; and
   repeating the reading the page and the testing until the data fails to contain the automatic detection magic number.

7. The method according to claim 6, wherein when it is determined the data does not contain the automatic detection magic number, further comprising:
   determining whether the counter exceeds a maximum number of pages marked with the automatic detection magic number, and, if so, signaling an error condition.

8. The method according to claim 1, further comprising:
   determining in hardware whether the memory device utilizes a smaller page size or a larger page size.

9. The method according to claim 1, further comprising:
   performing a read initialization command; and
   checking to determine whether the memory device is busy after a predetermined period of time.

10. The method according to claim 1,
    wherein each section contains dummy data.

11. The method according to claim 10, wherein the dummy data is a known value that allows error correction to be performed.

12. The method according to claim 1, wherein the memory device includes a NAND flash memory, an m-system flash memory, or a OneNAND flash memory.

13. An apparatus for automatically determining access parameters of a memory device means, comprising:
    means for determining a bus width of the memory device means; and
    means for determining a page size of the memory device means;
    wherein the memory device means which is divided into sections, each section comprising a first four byte word having an 8-bit magic number and second four byte word having a configuration magic number in first and second adjacent locations in the memory device means and an automatic detection magic number in a third location in the memory device means;
    wherein the means for determining the bus width comprises:
       means for reading a first four bytes from the memory device means in an eight bit mode; and
       means for determining whether the first four bytes read from the memory device means correspond to an interleaving of the first four byte word and the second four byte word; and
    wherein the means for determining a page size of the memory device means comprises:
       means for receiving minimum and maximum page sizes of the memory device means;
       means for determining a number of sections marked by computing a ratio of the maximum possible page size and the minimum possible page size;
       means for detecting a number of pages having an automatic detection magic number; and
       means for determining the page size of the memory device means by computing the ratio of the number of sections marked times the minimum possible page size and the detected number of pages with the automatic detection magic number.

14. The apparatus according to claim 13, further comprising:
    means for reading sequentially a series of pages from the memory device means; and
    means for counting the number of pages which contain the automatic detection magic number.

* * * * *

UNITED STATES PATENT AND TRADEMARK OFFICE
CERTIFICATE OF CORRECTION

| | |
|---|---|
| PATENT NO. | : 7,873,779 B2 |
| APPLICATION NO. | : 12/119587 |
| DATED | : January 18, 2011 |
| INVENTOR(S) | : Srini Maddali et al. |

It is certified that error appears in the above-identified patent and that said Letters Patent is hereby corrected as shown below:

Column 13, Line 64, Claim 6: "automatic detection marker, magic number" to read as automatic detection magic number Signed and Sealed this
Ninth Day of August, 2011

David J. Kappos
*Director of the United States Patent and Trademark Office*